United States Patent
Belen et al.

(10) Patent No.: US 8,722,543 B2
(45) Date of Patent: May 13, 2014

(54) COMPOSITE HARD MASK WITH UPPER SACRIFICIAL DIELECTRIC LAYER FOR THE PATTERNING AND ETCHING OF NANOMETER SIZE MRAM DEVICES

(75) Inventors: Rodolfo Belen, San Francisco, CA (US); Rongfu Xiao, Dublin, CA (US); Tom Zhong, Saratoga, CA (US); Witold Kula, Sunnyvale, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 214 days.

(21) Appl. No.: 12/804,840

(22) Filed: Jul. 30, 2010

(65) Prior Publication Data

US 2012/0028373 A1 Feb. 2, 2012

(51) Int. Cl.
*H01L 21/302* (2006.01)
*H01L 21/00* (2006.01)

(52) U.S. Cl.
USPC ........... 438/738; 438/689; 438/691; 438/705; 438/736; 257/295; 257/421; 257/E21.017; 257/E21.246; 257/E21.665

(58) Field of Classification Search
USPC .................. 438/689, 691, 705, 712, 736, 738; 257/295, 421, E21.017, E21.246, 257/E21.665
See application file for complete search history.

(56) References Cited

U.S. PATENT DOCUMENTS

| | | |
|---|---|---|
| 6,806,096 B1 | 10/2004 | Kim et al. |
| 6,984,529 B2 | 1/2006 | Stojakovic et al. |
| 7,001,783 B2 | 2/2006 | Costrini et al. |
| 7,060,194 B2 | 6/2006 | Kodaira et al. |
| 7,696,551 B2 | 4/2010 | Xiao et al. |
| 2003/0073251 A1 | 4/2003 | Ning |
| 2005/0277207 A1 | 12/2005 | Costrini et al. |
| 2007/0215911 A1 | 9/2007 | Torng et al. |
| 2009/0078927 A1 | 3/2009 | Xiao et al. |
| 2009/0261437 A1 | 10/2009 | Kang et al. |

OTHER PUBLICATIONS

PCT Search Report PCT/US 11/01156 Mail date-Nov. 8, 2011, Magic Technologies, Inc.

*Primary Examiner* — Thanh V Pham
(74) *Attorney, Agent, or Firm* — Saile Ackerman LLC; Stephen B. Ackerman (57) ABSTRACT

A composite hard mask is disclosed that prevents build up of metal etch residue in a MRAM device during etch processes that define an MTJ shape. As a result, MTJ shape integrity is substantially improved. The hard mask has a lower non-magnetic spacer, a middle conductive layer, and an upper sacrificial dielectric layer. The non-magnetic spacer serves as an etch stop during a pattern transfer with fluorocarbon plasma through the conductive layer. A photoresist pattern is transferred through the dielectric layer with a first fluorocarbon etch. Then the photoresist is removed and a second fluorocarbon etch transfers the pattern through the conductive layer. The dielectric layer protects the top surface of the conductive layer during the second fluorocarbon etch and during a substantial portion of a third RIE step with a gas comprised of C, H, and O that transfers the pattern through the underlying MTJ layers.

20 Claims, 4 Drawing Sheets

COMPOSITE HARD MASK WITH UPPER SACRIFICIAL DIELECTRIC LAYER FOR THE PATTERNING AND ETCHING OF NANOMETER SIZE MRAM DEVICES

RELATED PATENT APPLICATION

This application is related to the following: Ser. No. 11/901,999, filing date Sep. 20, 2007; assigned to a common assignee and herein incorporated by reference in its entirety.

FIELD OF THE INVENTION

The invention relates to a composite hard mask used in the fabrication of a magnetic tunnel junction (MTJ) element and includes an upper sacrificial dielectric layer to prevent a lower metal layer from forming metal residues during an etch transfer step thereby resulting in more uniform MTJ shapes which improves device performance.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

An MTJ element may be based on a tunneling magnetoresistance (TMR) effect wherein a stack of layers has a configuration in which two ferromagnetic layers are separated by a thin non-magnetic dielectric layer. An MTJ stack of layers may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer on a substrate.

The AFM layer holds the magnetic moment of the pinned layer in a fixed direction. The pinned layer has a magnetic moment that is fixed in the "y" direction, for example, by exchange coupling with the adjacent AFM layer. The free layer has a magnetic moment that is either parallel or anti-parallel to the magnetic moment in the pinned layer and is preferably made of NiFe because of its reproducible and reliable switching characteristics as demonstrated by a low switching field (Hc) and switching field uniformity (σHc). The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations. An alternative MRAM technology is referred to as spin-transfer torque (STT) MRAM. Unlike conventional MRAM that requires a separate word line in addition to a BIT line to switch the magnetization direction of a free layer in a MTJ, STT-MRAM relies only on a current passing through the MTJ to rotate the free layer magnetization direction.

Generally, the purpose of a capping layer or top electrode is to protect underlying layers in the MTJ during etching and other process steps and to function as an electrical contact to an overlying conductive line. In the fabrication of MRAM devices, well defined three dimensional nanometer sized features are created by patterning a photoresist or mask layer on a stack of MTJ layers and then transferring the pattern in the mask through multiple layers of magnetic layers using a reactive ion etch (RIE) process. Etching proceeds chemically which involves a surface reaction between gaseous reactants and the material being removed that generates volatile etch products. RIE offers a better approach to etching MTJs compared with conventional ion beam etching (IBE) methods where the material is etched physically through ion bombardment. In IBE, the resulting MTJ profile is highly tapered because the sputtered non-volatile etch products are deposited back onto the MTJ sidewalls so that the width of an uppermost top electrode along an easy axis direction is substantially less than that of a seed layer which contacts a bottom electrode. A tapered profile can not only lead to electrical shorting issues but also limits further reduction of critical dimension (CD) of MRAM devices and makes it nearly impossible to manufacture very high density IC devices such as spin torque MRAM.

In the current MRAM fabrication process, a heavy metal such as Ta is deposited on top of a MTJ stack of layers, and acts both as a hard mask for the etching of the MTJ stack and as an interlayer conduction channel to the top bit line as described in U.S. Pat. No. 7,060,194. The thickness of the heavy metal layer should be sufficient to prevent electrical shorting between the MTJ and overlying bit line. On the other hand, the heavy metal layer should not be too thick since a thicker photoresist mask will be required for pattern transfer and as the photoresist thickness increases there is a greater tendency for the photoresist pattern to collapse which drives more rework and higher cost. Therefore, the heavy metal layer thickness is determined by maintaining a balance between the need for a thicker layer to avoid electrical shorting and a thinner layer to prevent pattern collapse in an overlying photoresist layer.

Figure 1:
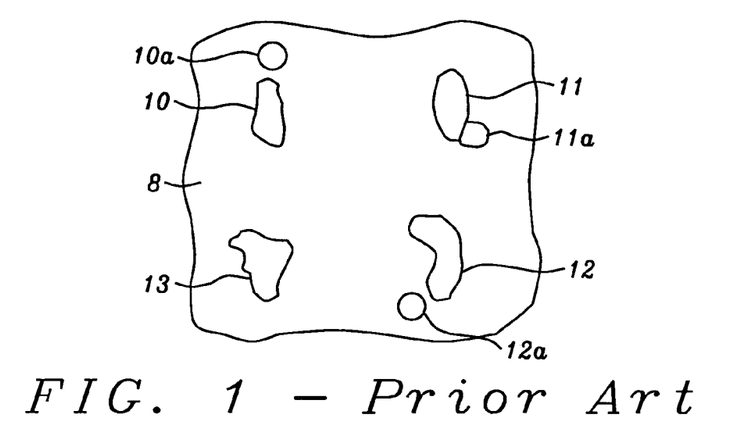
FIG. 1 is a top view of irregular shaped MTJ elements resulting from a RIE pattern transfer process in which Ta serves as a single hard mask layer.

Selection of an appropriate heavy metal to serve as a hard mask when etching a MTJ stack of layers is also critical. The ideal hard mask material should have a high etch rate selectivity to overlying and underlying layers, and more importantly should not be prone to metal etch residue buildup. Formation and buildup of metal etch residue significantly affects the shape integrity of MTJ structures which in turn affects MRAM device performance. When Ta is selected as the heavy metal hard mask material, it is well known that etching Ta in $CF_4$ plasma with an overlying photoresist mask is highly likely to deposit Ta etch residues on MTJ sidewalls. Consequently, MTJ shape integrity is lost and MRAM device performance suffers. Problems with shape integrity become more challenging as device CD shrinks. FIG. 1 shows a top view of examples of 80 nm×160 nm MTJ elements 10-13 formed on a substrate 8 and that were etched using a Ta hard mask (not shown). MTJs 10-13 are greatly deformed from the oval shape in the mask design used to generate a pattern in a photoresist layer (not shown). There are also defects comprising metal etch residue which are shown as shapes 10a, 12a that are separated from nearby MTJs 10, 12, respectively, and a defect 11a that is attached to a side of MTJ 11. In a manufacturing environment, the MTJ shapes and defects shown in FIG. 1 would be unacceptable and substrate 8 would require rework.

Fabrication of MTJ cell dimensions of about 100 nm or less requires a thin photoresist layer (<3000 Angstroms) to ensure an adequate process latitude when imaging small features on a hard mask that will later be transferred through the hard mask and a MTJ stack of layers. It is well known that an aspect ratio (thickness/width of a pattern feature) of about 3:1 or less is preferred to avoid pattern collapse during image development. However, a thin photoresist layer requires a thin Ta hard mask layer to guarantee that the hard mask pattern will be completely formed before the photoresist etch mask is consumed during the etch transfer step. Unfortunately, a thin Ta hard mask leads to potential issues of electrical shorting as mentioned previously and limits the amount of etch time available to transfer the hard mask pattern through the MTJ stack of layers because the hard mask erodes during the pattern transfer process. Thus, other alternatives besides a simple Ta hard mask are necessary when fabricating MTJ cells having an easy axis or hard axis dimension of about 100 nm or less.

One alternative described in U.S. Pat. No. 7,001,783 is a bilayer hard mask consisting of an upper dielectric layer made of $SiO_2$, silicon nitride, silicon carbide, or the like, and a lower heavy metal layer (Ta) that contacts the free layer in the MTJ stack of layers. A pattern in the dielectric layer is used to pattern the Ta layer. The dielectric layer is removed before a subsequent etch step is performed to transfer the Ta hard mask pattern into an upper magnet. Later, a second composite hard mask is laid down and is involved in patterning a lower magnet in the MTJ. Overall, the entire patterning sequence involves several additional steps than in a single composite hard mask scheme and there is no protection of the Ta hard mask during etching of MTJ layers. Therefore, a new MTJ hard mask design is needed that employs only one composite hard mask wherein a heavy metal layer such as Ta is protected during pattern transfer into the MTJ stack of layers so that shape integrity is not affected by undesirable metal etch residues.

U.S. Pat. No. 6,984,529 describes a patterned hard mask which is oxidized to form an oxide surface before etching the underlying MTJ stack of layers to form a MTJ element.

SUMMARY OF THE INVENTION

One objective of the present invention is to provide a MTJ hard mask design that prevents metal etch residue formation and build up on sidewalls of a MTJ during fabrication of a MRAM device.

A second objective of the present invention is to provide a MTJ hard mask configuration according to the first objective that is thin enough to enable a thin overlying photoresist layer to be patterned with an acceptable process latitude but is also thick enough to prevent electric shorting between an overlying bit line and the MTJ.

A third objective of the present invention is to provide a method of etching the hard mask and underlying MTJ layers so that the shapes of features in the photoresist layer according to the second objective are essentially reproduced in the MTJ element.

According to a first embodiment, these objectives are achieved by providing a substrate comprised of a bottom electrode layer on which a MRAM or STT-MRAM structure is to be fabricated. A MTJ is formed by first depositing a stack of layers on the bottom electrode layer. In one aspect, the MTJ stack has a bottom spin valve configuration in which a seed layer, AFM layer, synthetic anti-ferromagnetic (SyAF) pinned layer, tunnel barrier layer, and a free layer are sequentially formed. A key feature is the formation of a composite hard mask comprised of a thin non-magnetic metal spacer on the free layer, a middle conductive layer that has high etch selectivity with respect to underlying MTJ layers, and an upper sacrificial dielectric layer. The non-magnetic metal spacer serves as an etch stop for the etch transfer process through the middle conductive layer and also prevents a metal such as Ta in the conductive layer from migrating into the free layer and causing a lower magnetoresistive (MR) ratio. The middle conductive layer becomes the top layer in the hard mask after the MTJ stack of layers is etched. In a second embodiment, the non-magnetic metal spacer may be omitted such that the conductive layer contacts the free layer in the MTJ.

In one aspect, the lower portion of the composite hard mask comprised of the non-magnetic metal spacer and overlying conductive layer in the first embodiment or the conductive layer in the second embodiment may be considered as a capping layer or top electrode in the MTJ element to be formed during the fabrication scheme. All of the layers in the MTJ stack may be formed by sputtering or ion beam deposition (IBD) with the exception of the upper dielectric layer in the hard mask which may be deposited by a physical vapor deposition (PVD) or chemical vapor deposition (CVD) method. The MTJ stack of layers may be annealed at a temperature in the range of about 250° C. to 400° C. Once all the layers in the stack are laid down and thermally annealed to fix the pinned layer magnetization direction, a patterning and etching sequence is followed to fabricate a MTJ element.

First, a bottom anti-reflective coating (BARC) and a photoresist layer are sequentially coated on the composite hard mask. The photoresist layer is patterned to form arrays of features that define the hard axis and easy axis dimensions of the desired MTJ cells. Then the photoresist pattern is transferred through the BARC and upper dielectric layer in the hard mask by a first fluorocarbon etch that is timed to stop within the dielectric layer. After the BARC and remaining photoresist layer are removed by an oxygen ashing step, the pattern in the upper dielectric layer is transferred through the conductive layer by a second fluorocarbon etch that stops on the lower non-magnetic metal layer or on the free layer in the second embodiment. During a third RIE step, the pattern is transferred through the lower non-magnetic metal spacer and through the underlying MTJ stack of layers by a plasma including one or more gases comprised of C, H, and O such as $CH_3OH$, $C_2H_5OH$, or $CO/NH_3$ that have a high selectivity to exposed regions of the underlying layers in the MTJ stack relative to the conductive layer. In one embodiment, the third RIE step also proceeds through the bottom electrode such that a continuous sidewall is formed along the edge of the composite hard mask, MTJ element, and bottom electrode. Preferably, the upper dielectric layer is consumed during the third RIE step.

Thereafter, an insulation (MTJ ILD) layer is typically deposited on the substrate and over the plurality of MTJ elements, and is thinned by a CMP process to be substantially coplanar with the conductive layer in the hard mask. In an embodiment where the upper dielectric layer of the hard mask is formed with sufficient thickness to survive the third RIE step, it is removed during the CMP process. A top conductor (bit line) may then be formed on the conductive layer of the hard mask and on the MTJ ILD layer.

DETAILED DESCRIPTION OF THE INVENTION

The present invention is a hard mask design and a method of using the hard mask to form MTJ elements in advanced memory devices including MRAM and STT-MRAM. The drawings are provided by way of example and are not intended to limit the scope of the invention. Although a bottom spin valve MTJ structure is described in the exemplary embodiment, the present invention also encompasses other MTJ configurations such as top spin valve and multi-layer spin valve structures. The present invention also anticipates that the hard axis and easy axis dimensions of a MTJ element may be formed in separate steps. In this case, the sequence of photoresist patterning and subsequent etch steps outlined in the exemplary embodiment may be used to define a first CD that is an x-axis dimension of a MTJ, for example. Then the sequence of photoresist patterning and etch steps may be repeated to define a second CD that is a y-axis dimension of the MTJ. Only one MTJ is shown in the exemplary embodiment in order to simplify the drawings.

Figure 2:
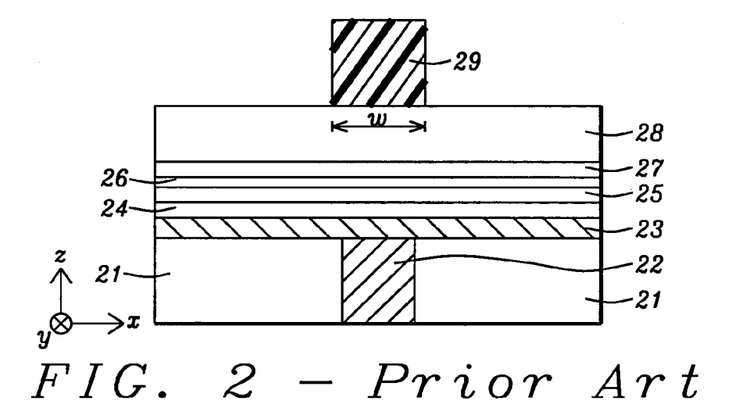
FIGS. 2-4 are cross-sectional views showing a conventional process flow where a photoresist pattern formed on a Ta hard mask is transferred through the hard mask by a first etch step (FIG. 3) and then through a MTJ stack in a second etch step (FIG. 4).
Figure 3:
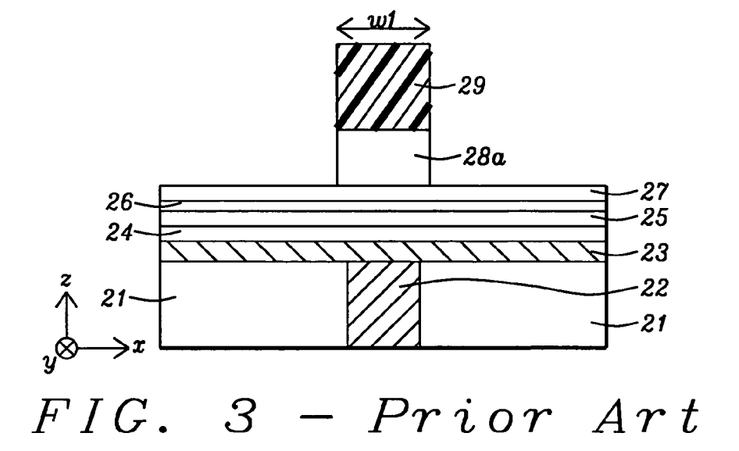
Figure 4:
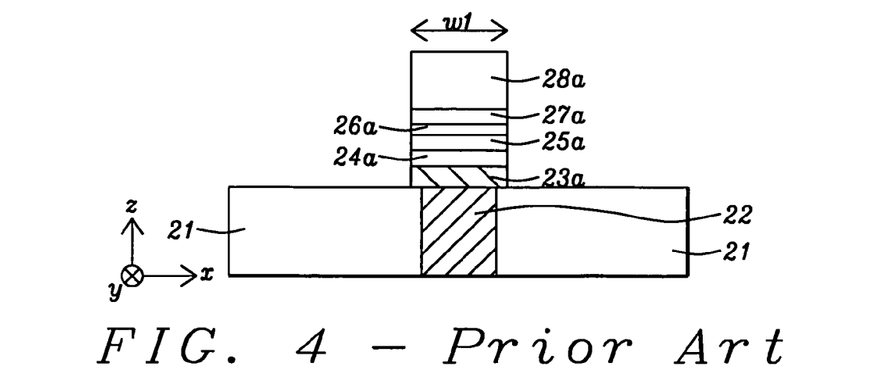

The inventors have previously practiced a MTJ fabrication sequence illustrated in FIGS. 2-4. FIG. 2 depicts a partially completed MRAM cell in which a via 22 formed within a dielectric layer 21 is connected to an underlying transistor in a substructure (not shown). A MTJ stack of layers is shown on the bottom electrode 23 and comprises a buffer layer 24 that may be a composite including a lower seed layer and an upper AFM layer, pinned layer 25, tunnel barrier layer 26, free layer 27, and Ta hard mask layer 28. A photoresist layer is coated on hard mask layer 28 and patterned to form an island 29 with a critical dimension w along an x-axis dimension. In FIG. 3, a first reactive ion etch (RIE) step is performed to transfer the pattern through the hard mask layer to form Ta hard mask 28a having a width w1 that is not necessarily the same as w. Next, the photoresist 29 is stripped. Then, a second RIE step is used to transfer the pattern through the underlying MTJ layers and bottom electrode to form a MTJ element comprised of layers 24a-28a on bottom electrode 23a. As shown previously in FIG. 1, etching a Ta hard mask 28a with an exposed top surface causes a build up of metal etch residue along the sides of the MTJ layers that can easily lead to an irregular MTJ shape from a top view along the z-axis that is substantially different than the intended oval shape. Therefore, we were motivated to overcome the Ta etch residue issue with a new hard mask design that is readily integrated into a MRAM fabrication scheme.

In a related patent application Ser. No. 11/901,999, we disclosed a trilayer hard mask for patterning nanometer sized MTJs. The trilayer hard mask has a configuration with a lower non-magnetic metal layer, a middle metal spacer, and an upper Ta or TaN conductive layer. We have found a new composite hard mask that retains the advantages of the earlier hard mask structure while offering improvement in terms of substantially lowering metal etch residue thereby providing better shape integrity of the MTJ elements formed by a hard mask etch sequence described herein.

Figure 5:
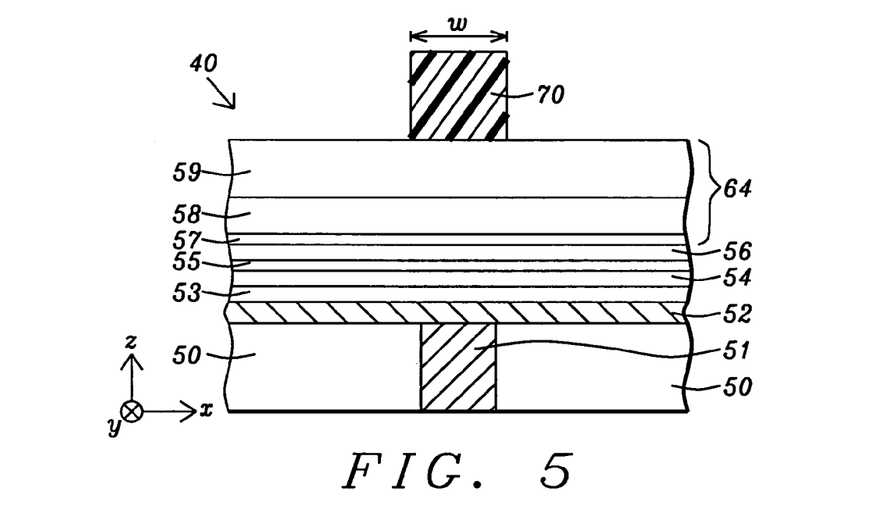
FIG. 5 is a cross-sectional view showing a MTJ stack of layers and an overlying composite hard mask formed according to a first embodiment of the present invention.

A method of fabricating a plurality of MTJs in a MRAM array by employing a composite hard mask structure according to a first embodiment of the present invention will now be described. It should be understood that although only one MTJ is shown in the exemplary embodiment, there are a plurality of MTJs formed in a pattern that includes multiple rows and columns of MTJs in a MRAM array. Referring to FIG. 5, a partially completed MRAM 40 is shown that has a via 51 formed within a first insulation layer 50 made of SiOx, SiN, SiON, $Al_2O_3$, or a low k dielectric material, for example. Via 51 is typically connected to an underlying transistor (not shown). There is a bottom electrode layer 52 formed on the via 51 and first insulation layer. The bottom electrode layer 52 may be a composite layer made of conductive materials as appreciated by those skilled in the art.

A MTJ stack of layers is formed on the bottom conductor layer 52 and may be deposited in the same process tool as the bottom conductor layer. For instance, the bottom conductor layer 52 and MTJ stack may be formed in an Anelva C-7100 thin film sputtering system or the like which typically includes three physical vapor deposition (PVD) chambers each having five targets, an oxidation chamber, and a sputter etching chamber. Usually, the sputter deposition process involves an argon sputter gas and the targets are made of metal or alloys to be deposited on a substrate. The bottom conductor layer 52 and overlying MTJ layers may be formed after a single pump down of the sputter system to enhance throughput.

In a preferred embodiment, the MTJ stack of layers is fabricated on the bottom conductor layer 52 by sequentially forming a lower portion 53 comprised of a lower seed layer and upper AFM layer, pinned layer 54, tunnel barrier layer 55, free layer 56, and composite hard mask 64. The lower portion 53, pinned layer 54, tunnel barrier layer 55, and free layer 56 may be comprised of conventional materials. For example, the seed layer may be one of NiCr, NiFe, NiFeCr, or the like. The AFM layer is preferably made of MnPt although IrMn, NiMn, OsMn, RuMn, RhMn, PdMn, RuRhMn, or MnPtPd or the like are also acceptable AFM layer materials. In the exemplary embodiment, the AFM layer is magnetically aligned in the x-axis direction to maintain the magnetization direction in the pinned layer 54 along the x-axis.

The pinned layer 54 may be a synthetic antiferromagnetic (SyAF) layer having an AP2/coupling layer/AP1 configuration. Use of a SyAF pinned layer in the MTJ structure not only improves thermal stability but also reduces the interlayer coupling field (offset field) applied to the free layer. The AP2 layer is formed on the AFM layer and may be comprised of CoFe while the coupling layer is made of Ru, and the AP1 layer may be comprised of one or both of CoFe and CoFeB, for example. A slight difference in thickness between the AP2 and AP1 layers produces a small net magnetic moment for the SyAF pinned layer along the x-axis. Exchange coupling between the AP2 layer and the AP1 layer is facilitated by the coupling layer.

The tunnel barrier layer 55 may be made of MgO, AlOx, or AlTiOx. The free layer 56 may be comprised of one or more of CoFeB CoFe, and NiFe and is magnetically aligned along the x-axis (pinned layer direction). When the MTJ is elliptically shaped as seen in a top view (not shown), the easy axis of the MTJ element is preferably along the long axis and the hard axis is along the short axis.

According to one embodiment of the present invention, a key feature is a composite hard mask 64 comprising a lower non-magnetic metal spacer 57 formed on the free layer 56, a middle conductive layer 58, and an upper sacrificial dielectric layer 59 which is removed during the MRAM fabrication sequence. The composite hard mask may be employed instead of a conventional capping layer on the free layer 56 and may be considered as a top electrode. Non-magnetic spacer 57 is preferably a metal or metal alloy made of MnPt, Ti, Ru, Cu, Zr, Mg, or NiFeHf with a Hf content of about 15 to 25 atomic %. Middle conductive layer 58 is comprised of Ta, TaN, Ti, TiN, W, or the like. Non-magnetic metal spacer 57 prevents a metal such as Ta in the conductive layer from migrating into the free layer and degrading the magnetoresistive (MR) ratio of the MTJ, and also serves as an etch stop layer during a fluorocarbon etch that patterns the overlying conductive layer 58. Thus, the non-magnetic spacer 57 with a thickness from 50 to 500 Angstroms protects the surface of the free layer 56 from fluorocarbon plasma during a pattern transfer step through the overlying conductive layer 58. In an embodiment wherein MnPt is selected as the non-magnetic spacer, the thickness of the MnPt layer is preferably around 300 Angstroms.

The conductive layer 58 preferably has a thickness between 200 and 600 Angstroms and in a conventional MRAM embodiment is thin enough so that a subsequently formed bit line (not shown) is able to provide a strong magnetic switching field on the free layer 56 during a write process. On the other hand, the conductive layer must have sufficient thickness to prevent magnetization in a cladded bit line from inadvertently switching the free layer during non-writing intervals. Typically, bit lines and word lines are cladded with Fe, Co, Ni or alloys thereof to provide a stronger switching field on the free layer than in MRAM structures having bit/word lines with no cladding. However, the composite hard mask of the present invention and method of forming a MRAM device as described herein also applies to STT-MRAM structures where there is no bit line cladding and a bit line is electrically connected through a MTJ to an underlying CMOS connection pad to enable read and write processes. In a STT-MRAM embodiment, the composite hard mask of the present invention is primarily relied upon to minimize metal etch residue during RIE transfer steps.

Dielectric layer 59 is comprised of silicon oxide, silicon nitride, silicon carbide, or silicon oxynitride with a thickness between 300 and 1200 Angstroms and is initially formed as the uppermost layer on the stack of MTJ layers before the MTJ stack is patterned to form a MTJ element with sidewalls. Moreover, the dielectric layer 59 may be doped with another element such as H or N. An important feature of dielectric layer 59 is that it protects the underlying conductive layer 58 during a plasma etch step when openings in the dielectric layer are transferred into the conductive layer. As explained earlier, unprotected metal surfaces have a tendency to form metal etch residues during a fluorocarbon etch process and these residues can build up along the MTJ sidewalls and deform the shape of the resulting MTJ element. In the present invention, only a small portion of the surface of conductive layer 58 is exposed to fluorocarbon plasma and the exposed portions are removed in order to form openings in the conductive layer that will subsequently be used to define an underlying MTJ element. In one aspect, the dielectric layer must not be so thick as to require a thick photoresist masking layer in order to transfer a pattern in the photoresist layer through the dielectric layer. Those skilled in the art recognize that a photoresist layer more than about 2000 to 3000 Angstroms thick will limit the process window for printing features with a critical dimension (CD) less than about 100 nm in size needed in advanced MRAM designs. Typically, an aspect ratio of more than about 3:1 (photoresist thickness/photoresist CD) leads to significant pattern collapse which means rework and higher production cost.

The present invention also encompasses one or more annealing steps after the stack of MTJ layers and the sacrificial dielectric layer 59 have been deposited. For example, in the exemplary embodiment, the MTJ stack of layers including the composite hard mask may be annealed in a vacuum by applying a magnetic field of 10K Oe in magnitude along the y-axis (easy axis) for 1 to 5 hours at a temperature of about 250° C. to 400° C. An annealing step comprising a magnetic field applied along the hard axis may also be performed.

Figure 6:
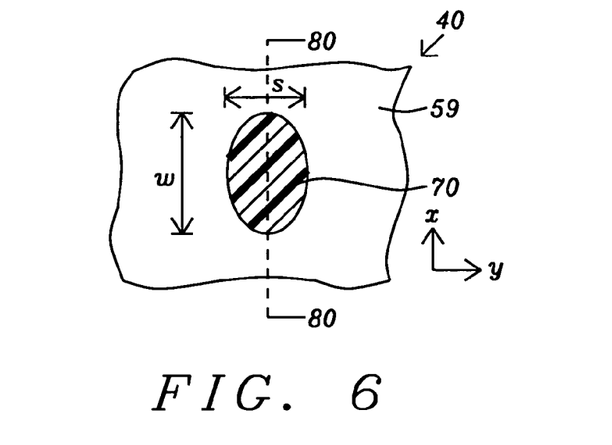
FIG. 6 is a top view of an oval shaped photoresist pattern formed on the composite hard mask in FIG. 5.

Returning to FIG. 5, after all of the MTJ layers have been deposited and annealing is completed, a MTJ element with sidewalls is fabricated by sequentially coating a BARC (not shown) and then a photoresist layer on the sacrificial dielectric layer 59 and patterning a plurality of photoresist features 70 that have a minimum dimension (CD) or width s (FIG. 6). In one aspect, s is about 100 nm or less in order to meet the design rules of advanced memory devices such as STT-MRAMs. Only one of the photoresist features is illustrated in order to simplify the drawing. Preferably, a very thin bottom anti-reflective layer or BARC is formed on the dielectric layer 59 prior to coating the photoresist layer in order to facilitate a larger process window for imaging the photoresist feature 70 that typically involves patternwise exposure through a quartz mask followed by treatment with aqueous base developer to remove soluble portions of the photoresist film.

Referring to FIG. 6, a top view of the partially completed MRAM structure 40 is shown. Note that the cross-sectional view in FIG. 5 is taken along the plane 80-80. In this embodiment, the photoresist pattern has a first dimension w along the x-axis (easy axis) and a second dimension s along the y-axis (hard axis) where w>s. The present invention also anticipates that other photoresist designs such as circles or eye shapes may be employed instead of ovals depending on the shape desired for the resulting MTJ element in the MRAM structure.

In one example, the inventors have practiced a process wherein the MTJ stack of layers has a lower portion 53 comprised of a NiCr seed layer and a MnPt AFM layer, a CoFe/Ru/CoFe or CoFe/Ru/CoFeB SyAF pinned layer 54, an AlOx or MgO tunnel barrier 55, a CoFe/NiFe or CoFeB free layer 56, and a hard mask having a 300 Angstrom thick lower MnPt layer 57, a 300 Angstrom thick middle conductive layer 58 made of Ta, and an 800 Angstrom thick silicon oxide dielectric layer 59. A 600 Angstrom thick BARC layer and a 2400 Angstrom thick photoresist layer 70 were sequentially formed on the composite hard mask before patterning the photoresist layer to form features where w is 160 nm and s is 80 nm.

Figure 7:
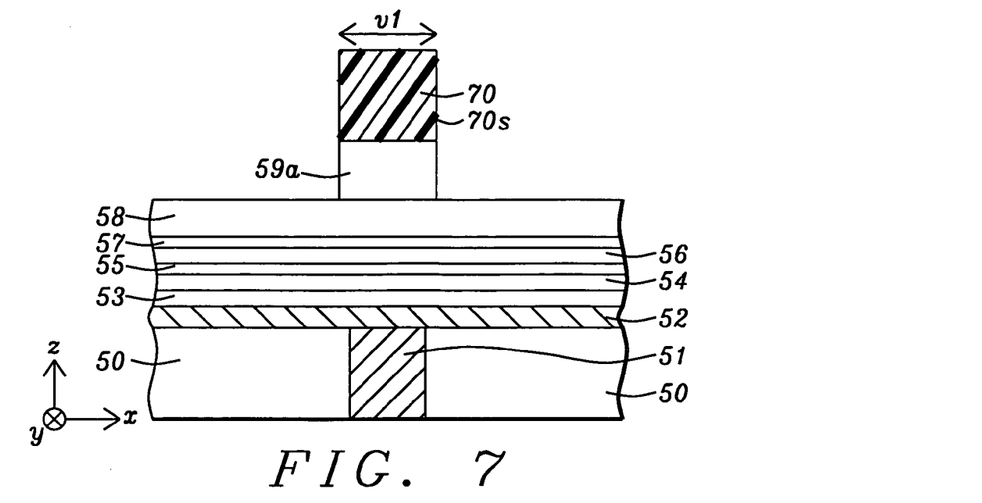
FIGS. 7-9 are cross-sectional views depicting the use of a composite hard mask to form a MTJ in a MRAM device according to a method of the present invention where a first etch step transfers a photoresist pattern into a dielectric layer (FIG. 7), a second etch step transfers the pattern through a conductive layer (FIG. 8), and a third etch step transfers the pattern through a non-magnetic spacer and underlying MTJ stack (FIG. 9).

Referring to FIG. 7, the photoresist feature 70 is employed as an etch mask during a first reactive ion etch (RIE) step that transfers the shape of photoresist feature 70 substantially through the upper dielectric layer 59 to form a patterned dielectric layer 59a. In other words, the first RIE step may be a timed etch that is intended to stop on the middle conductive layer 58 but in certain regions of the substrate may leave a thin dielectric layer that is removed during a subsequent step. Depending on etch conditions, the width of photoresist feature 70 may change by a few nanometers due to polymer deposition along sidewalls 70s or because of a lateral erosion of the sidewalls to give a width v1. Typically, the sidewall 70s is essentially vertical so that width v1 is replicated in dielectric layer 59a. The first RIE step is preferably a process comprised of a fluorocarbon gas such as $CF_4$, $C_2F_6$, $C_4F_8$, $CHF_3$, $CH_2F_2$, or the like. The first etching step may comprise a source RF power of 200 to 600 Watts, a bias RF power of 20 to 80 Watts, and a fluorocarbon flow rate of 30 to 80 standard cubic centimeters per minute (sccm) so that the photoresist feature 70 is not completely consumed before the feature shape is transferred through essentially the entire dielectric layer 59.

In one embodiment where dielectric layer 59 is made of silicon oxide, the first RIE step preferably comprises $CF_4$ plasma with a 4.5 mTorr pressure, 500 Watt source power, 50 Watt bias power, and a 50 sccm gas flow rate. The first RIE step stops on the conductive layer 58 which has a 110 nm/minute etch rate in $CF_4$ plasma compared with a 120 nm/minute etch rate for dielectric layer 59 as shown in Table 1.

TABLE 1

Etching Rate of Selected MRAM Materials

| Material | MTJ layer | Fluorocarbon etch (nm/min) | $CH_3OH$ etch step (nm/min.) |
|---|---|---|---|
| Silicon oxide | Sacrificial dielectric layer 59 | 120 | 56 |
| Ta | Conductive layer 58 | 109.9 | 4.1 |
| TaN | Conductive layer 58 | 113.7 | 4.0 |
| NiFe | Free layer 56, Pinned layer 54 | 2.2 | 63.7 |
| CoFe | Free layer 56, Pinned layer 54 | 1.8 | 40.9 |
| CoFeB | Free layer 56, Pinned layer 54 | 1.8 | 27.2 |
| PtMn | AFM layer, non-magnetic spacer 57 | 2.4 | 60.5 |
| Ru | Non-magnetic spacer 57 | 8.5 | 28.5 |
| Cu | Non-magnetic spacer 57 | 1.6 | 135.7 |
| Mg | Non-magnetic spacer 57 | 0.8 | 8.3 |
| NiCr | Seed layer 53 | 3.2 | 21.0 |

Etch rates for various materials in the MTJ stack of layers during conditions used for the RIE steps of the present invention are shown in Table 1. In particular, it is important to have a high selectivity between the conductive layer 58 and underlying MTJ layers in the fluorocarbon ($CF_4$) etch which means the conductive layer should have a substantially higher etch rate during the fluorocarbon etch than underlying MTJ layers. On the other hand, during the third RIE step which includes an etchant comprised of a gas with C, H, and O composition such as $CH_3OH$ or the like as described in a later section, the conductive layer serves as an etch mask and should have a substantially lower etch rate than the underlying MTJ layers.

Returning to FIG. 8, the photoresist feature 70 and underlying BARC layer are stripped after the first etch step is completed. In one embodiment, the photoresist removal process may be achieved by an oxygen ashing method in a RIE chamber with the following conditions: 7.5 mTorr pressure; 500 Watts source power; 300 Watts bias power; and a 100 sccm oxygen flow rate.

Figure 8:
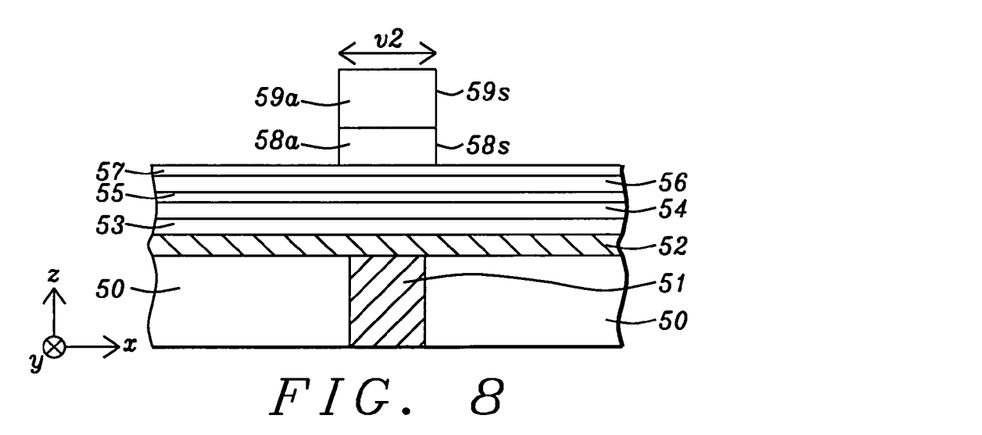

Thereafter, the dielectric layer 59a serves as a mask during a second RIE step that removes regions of conductive layer 58 not covered by the dielectric layer. In an embodiment where the conductive layer 58 is made of Ta, the second RIE step may comprise the following conditions: 4.5 mTorr pressure, 500 Watt source power; 50 Watt bias power, and a 50 sccm $CF_4$ gas flow. In other words, the second RIE step may include the same process conditions as the first RIE step when the composite hard mask 64 has a Ta conductive layer 58 and a silicon oxide dielectric layer 59. Again, the etch process may change the width of the resulting stack of layers including dielectric layer 59a and conductive layer 58a depending on whether or not material is deposited on or removed from the sidewalls 59s. For example, fluorocarbon polymer may deposit as a thin layer along sidewalls 59s such that width v2 of layers 58a, 59a is greater than width v1. Since an oxide dielectric layer 59 and conductive layer 58 have similar etch rates, the former must be thicker than the latter so that there is a portion of the dielectric layer 59a remaining after conductive layer 58a is etched. This is an important feature since dielectric layer 59a serves to protect the surface of conductive layer 58a during the second RIE step and for at least a substantial portion of the following third RIE step.

Figure 9:
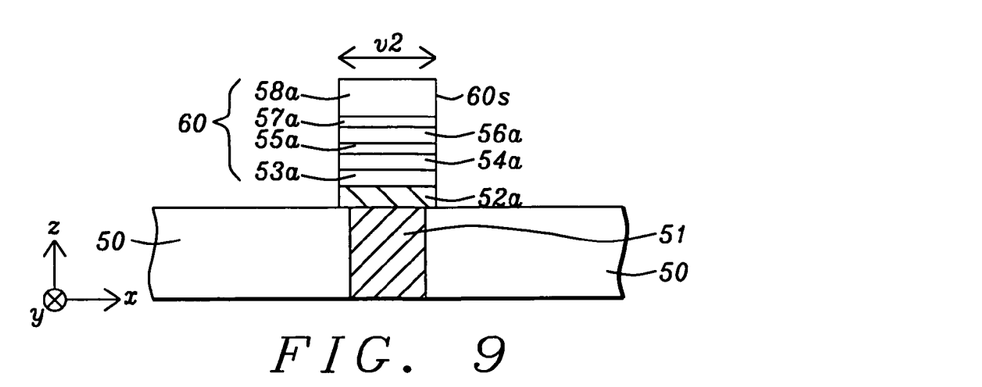

Referring to FIG. 9, a third RIE step is performed to transfer the conductive layer 58a pattern through the underlying MTJ stack of layers including non-magnetic metal spacer 57 by an etch process that is preferably performed in a different etching chamber than was used for the fluorocarbon RIE steps and oxygen ashing step. The etch rate for the conductive layer 58a should be substantially less than for exposed regions of the underlying MTJ layers such as free layer 56 and pinned layer 54 so that the shape in conductive layer 58a is transferred through the remaining MTJ stack of layers without consuming the entire thickness of the conductive layer. Dielectric layer 59a also serves as a masking layer during the pattern transfer and protects the conductive layer 58a for at least a substantial portion of the third RIE step.

As indicated in the far right column of Table 1, other materials in the MTJ stack of layers etch from 8 to more than 10 times faster than a Ta conductive layer 58*a* when using a $CH_3OH$ etch chemistry. Preferably, the etch chemistry for the third RIE step comprises one or more gases or gas combinations containing C, H, and O such as $CH_3OH$, $C_2H_5OH$, and $CO/NH_3$. Note that in the case of $CO/NH_3$, two gases are used to provide the C, H, and O etchant composition. In the example where $CH_3OH$ is used as the etching gas for the third RIE step, process conditions comprise a 3 mTorr pressure, a $CH_3OH$ flow rate between 10 and 30 sccm and preferably 15 sccm, a source RF power of 800 to 1800 Watts and preferably 1500 Watts, and a bias RF power of 500 to 1500 Watts and preferably 1300 Watts for a period of 50 to 100 seconds. Note that the shape in conductive layer 58*a* is substantially reproduced in underlying MTJ layers to form a MTJ element 60 comprised of patterned layers 53*a*-58*a*. In one embodiment, the third RIE step proceeds through the bottom electrode layer to produce a patterned bottom electrode 52*a* such that there is a continuous sidewall 60*s* along layers 52*a*-58*a*. Optionally, the bottom electrode layer 52 may be patterned in a different process sequence than the MTJ patterning sequence.

Figure 10:
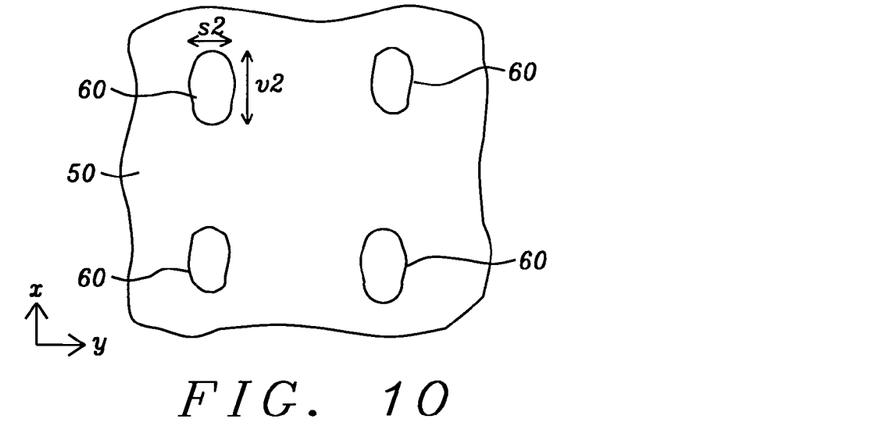
FIG. 10 is a top view of the MRAM structure in FIG. 9.

According to one embodiment of the present invention, the dielectric layer 59*a* is removed during the third RIE step. Referring to FIG. 10, a top view of the partially completed MRAM is depicted following the third RIE step through the MTJ stack of layers to form an MTJ element 60. In the exemplary embodiment, a photoresist pattern comprised of a plurality of islands having an oval shape as shown in FIG. 6 is used to define the underlying MTJ elements 60. Note that the oval shape of the original mask (FIG. 6) is essentially replicated in the resulting MTJ 60 with a first dimension v2 along the x-axis and a second dimension s2 along the y-axis. As indicated previously, v2 may be smaller or larger than w depending on the etch conditions during the plasma etching steps. Likewise, s2 may be larger or smaller than the original second dimension s along the y-axis. However, because of the hard mask configuration employed herein, there is no substantial buildup of conductive metal residue along MTJ sidewalls and therefore no distortion of the oval shape in the patterned MTJ elements 60.

Figure 11:
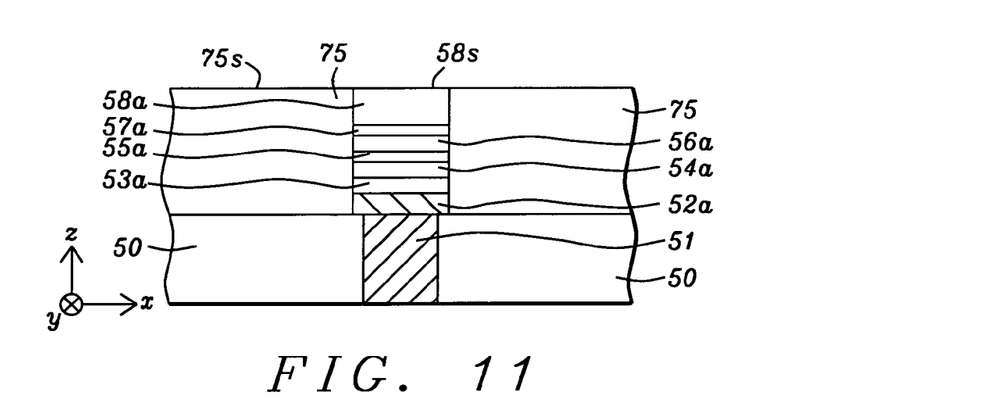
FIG. 11 is a cross-sectional view of the MRAM structure in FIG. 9 after a MTJ ILD layer is deposited and a CMP process performed.

Referring to FIG. 11, once the third RIE step is completed, a conventional wet clean step may be performed to remove any residues. Then a MTJ ILD layer 75 made of $SiO_2$, for example, is deposited on the first dielectric layer 50 by a CVD or PVD method to a thickness above the top surface 58*s*. Thereafter, a CMP process is performed to planarize the MTJ ILD layer 75 so that it becomes coplanar with the top surface 58*s* of conductive layer 58*a*. Thus, any dielectric layer 59*a* remaining after the third RIE step is removed by the aforementioned CMP process. Thereafter, a bit line (not shown) that contacts the top surface 58*s* may be formed as part of an array of bit lines according to a conventional method.

Figure 12:
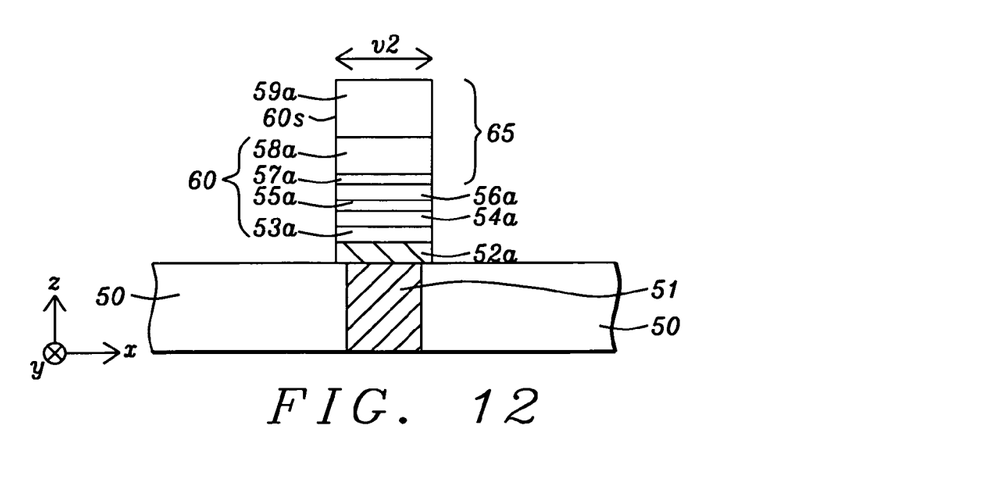
FIG. 12 is a cross-sectional view of a MTJ and an overlying hard mask stack after a third etch step that forms a continuous sidewall along all etched layers, and where all hard mask layers are retained according to an embodiment of the present invention.

In another embodiment, dielectric layer 59*a* is retained following the third etch step, and is removed in a subsequent CMP step following deposition of a MTJ interlevel dielectric (ILD) layer on the patterned MTJ 60 similar to the process described in the previous paragraph. Referring to FIG. 12, hard mask stack 65 including top dielectric layer 59*a*, middle conductive layer 58*a*, and lower conductive layer 57*a* is depicted following the third etch step that forms a continuous sidewall 60*s* along all layers 52*a*-59*a*.

In a second embodiment of the present invention, the lower non-magnetic spacer 57 is omitted so that the conductive layer 58 contacts a top surface of free layer 56. Therefore, the second RIE step stops on the free layer 56. Otherwise, the MTJ fabrication sequence proceeds as outlined in the first embodiment. The composition and thickness of bottom electrode 52, MTJ layers 53-56, conductive layer 58, and sacrificial dielectric layer 59 are the same as in the first embodiment. In this embodiment, the composite hard mask as deposited on the MTJ stack of layers is comprised of a lower conductive layer 58 and upper dielectric layer 59. The dielectric layer 59 is removed during the third RIE step or during a subsequent CMP step to planarize the MTJ ILD layer 75 such that only patterned conductive layer 58*a* remains from the original composite hard mask in the final MRAM structure.

The present invention offers an advantage not provided in the prior art. In particular, a composite hard mask design is disclosed for forming a MTJ in a memory device such that a build up of metal etch residue is avoided during the RIE steps that define the MTJ shape. As a result, MTJ shape integrity is significantly improved over what is currently achieved with existing hard mask designs and etch transfer schemes. Moreover, the thickness of the conductive layer in the composite hard mask may be adjusted so there is sufficient separation between the MTJ free layer and overlying bit line to prevent electrical shorting. Furthermore, the thickness of the sacrificial dielectric layer may be adjusted to allow a thin overlying photoresist layer to be patterned with fine features without pattern collapse issues. As a result, higher MRAM device yield and a higher performing MRAM device are achieved.

While this invention has been particularly shown and described with reference to, the preferred embodiment thereof, it will be understood by those skilled in the art that various changes in form and details may be made without departing from the spirit and scope of this invention.

We claim:

1. A composite hard mask used for the fabrication of a MTJ element in a MRAM device, comprising:
    (a) a lower non-magnetic spacer made of a metal or metal alloy that is one of MnPt, Ru, Cu, Zr, Mg, or NiFeHf with a lower surface that contacts a free layer in a MTJ stack of layers, said non-magnetic spacer has an etch rate substantially higher than an overlying conductive layer and the MTJ stack of layers including a pinned layer and a tunnel barrier layer in a single step to define a MTJ element;
    (b) a middle conductive layer that is one of Ta, TaN, TiN, and W and contacts an upper surface of said non-magnetic spacer and has an etch rate substantially higher than the non-magnetic spacer; and
    (c) an upper dielectric layer that is comprised of silicon oxide, silicon nitride, silicon carbide, or silicon oxynitride and contacts an upper surface of the middle conductive layer and wherein all layers including upper dielectric layer and middle conductive layer and the lower non-magnetic spacer have a common sidewall.

2. The composite hard mask of claim 1 wherein the non-magnetic spacer has a thickness of about 50 to 500 Angstroms.

3. The composite hard mask of claim 1 wherein the conductive layer has a thickness from about 200 to 600 Angstroms.

4. The composite hard mask of claim 1 wherein the dielectric layer has a thickness between about 300 and 1200 Angstroms.

5. The composite hard mask of claim 1 wherein the lower non-magnetic spacer is made of MnPt with a thickness of about 300 Angstroms, the middle conductive layer is Ta with thickness of about 300 Angstroms, and the upper dielectric layer is silicon dioxide having a thickness of about 800 Angstroms.

6. A composite hard mask used for the fabrication of a MTJ element in a MRAM device, comprising:

(a) a lower conductive layer made of TaN, Ti, TiN, or W that contacts an upper surface of a free layer in a MTJ stack of layers and has an etch rate substantially higher than the free layer and MTJ stack of layers; and (b) an upper dielectric layer comprised of silicon oxide, silicon nitride, silicon carbide, or silicon oxynitride that contacts an upper surface of the conductive layer and a hard mask stack including upper dielectric layer and lower conductive layer having a common sidewall, and the MTJ stack of layers including a pinned layer and a tunnel barrier layer between the free layer and pinned layer.

7. The composite hard mask of claim 6 wherein the lower conductive layer has a thickness from about 200 to 600 Angstroms.

8. The composite hard mask of claim 6 wherein the upper dielectric layer has a thickness between about 300 and 1200 Angstroms.

9. A method of forming a MTJ element in a memory device, comprising:

(a) forming a MTJ stack of layers comprising a seed layer, AFM layer, pinned layer, tunnel barrier layer, and a free layer on a substrate;

(b) forming a composite hard mask that contacts a top surface of said MTJ stack of layers, said composite hard mask is comprised of;

(1) a lower non-magnetic spacer that is one of MnPt, Ru, Cu, Zr, Mg, or NiFeHf and has an etch rate substantially higher than an overlying conductive layer in regions exposed to a subsequent MTJ etch process comprised of one or more gases having a C, H, and O composition;

(2) a middle conductive layer that is Ta, TaN, TiN, or W and contacts an upper surface of said non-magnetic spacer and has an etch rate substantially higher than the non-magnetic spacer during a fluorocarbon etch process used to transfer a pattern in an overlying dielectric layer through the middle conductive layer; and (3) an upper dielectric layer comprised of silicon oxide, silicon nitride, silicon carbide, or silicon oxynitride that contacts an upper surface of the middle conductive layer and protects the middle conductive layer during the fluorocarbon etch process and during at least a substantial portion of the MTJ etch process comprised of one or more gases having a C, H, and O composition;

(c) sequentially coating a bottom anti-reflective coating (BARC) and a photoresist layer on an upper surface of the upper dielectric layer, and then patterning said photoresist layer to form a plurality of features having MTJ easy-axis and hard-axis dimensions;

(d) transferring said plurality of features through the upper dielectric layer with a first reactive ion etch (RIE) step comprised of a fluorocarbon gas;

(e) removing said photoresist layer and BARC with an oxygen ashing step;

(f) transferring said plurality of features through the middle conductive layer with a second fluorocarbon RIE step to generate a hard mask stack including an upper dielectric layer and underlying conductive layer having a common sidewall; and (g) transferring said plurality of features through the non-magnetic spacer and MTJ stack of layers with a third RIE step comprised of one or more gases with a C, H, and O composition, said third RIE step completely removes the upper dielectric layer, and the middle conducting layer and non-magnetic spacer have a common sidewall.

10. The method of claim 9 wherein the lower non-magnetic metallic spacer has a thickness of about 50 to 500 Angstroms.

11. The method of claim 9 wherein the middle conductive layer has a thickness from about 200 to 600 Angstroms.

12. The method of claim 9 wherein the dielectric layer has a thickness between about 300 and 1200 Angstroms.

13. The method of claim 9 wherein the first and second RIE steps are comprised of $CF_4$, $C_2F_6$, $C_4F_8$, $CHF_3$, or $CH_2F_2$, a RF source power between about 200 to 600 Watts, a RF bias power from about 20 to 80 Watts, and a fluorocarbon flow rate of about 30 to 80 standard cubic centimeters per minute (sccm).

14. The method of claim 9 wherein the third RIE step is comprised of $CH_3OH$, $C_2H_5OH$, or $CO/NH_3$.

15. The method of claim 14 wherein $CH_3OH$ is selected for the third RIE step and has a pressure of about 3 mTorr, a flow rate between about 10 and 30 sccm, a source RF power of about 800 to 1800 Watts, and a bias RF power of about 500 to 1500 Watts.

16. A method of forming a MTJ element in a memory device, comprising:

(a) forming a MTJ stack of layers comprising a seed layer, AFM layer, pinned layer, tunnel barrier layer, and a free layer on a substrate;

(b) forming a composite hard mask that contacts a top surface of said MTJ stack of layers, said composite hard mask is comprised of;

(1) a lower conductive layer that is one of TaN, Ti, TiN, or W and has an etch rate substantially higher than the free layer and MTJ stack of layers during a subsequent fluorocarbon etch process used to transfer a pattern in an overlying dielectric layer through the conductive layer, and said lower conductive layer has an etch rate substantially lower than the MTJ stack of layers during a subsequent MTJ etch process that transfers the pattern through the MTJ stack of layers; and (2) an upper dielectric layer comprised of silicon oxide, silicon nitride, silicon carbide, or silicon oxynitride that contacts an upper surface of the conductive layer and protects the lower conductive layer during the fluorocarbon etch process and during at least a substantial portion of a MTJ etch process used to transfer the pattern through the free layer and the MTJ stack of layers;

(c) sequentially coating a bottom anti-reflective coating (BARC) and a photoresist layer on an upper surface of the upper dielectric layer, and then patterning said photoresist layer to form a plurality of features having MTJ easy-axis and hard-axis dimensions;

(d) transferring said plurality of features through the upper dielectric layer with a first RIE step comprised of a fluorocarbon gas;

(e) removing said photoresist layer and BARC with an oxygen ashing step;

(f) transferring said plurality of features through the lower conductive layer with a second fluorocarbon RIE step to define a hard mask stack including upper dielectric layer and lower conductive layer having a common sidewall; and (g) transferring said plurality of features through the MTJ stack of layers with a third RIE step comprised of one or more gases with a C, H, and O composition, said third RIE step completely removes the upper dielectric layer.

17. The method of claim 16 wherein the lower conductive layer has a thickness from about 200 to 600 Angstroms.

18. The method of claim 16 wherein the dielectric layer has a thickness between about 300 and 1200 Angstroms.

19. The method of claim 16 wherein the first and second RIE steps are comprised of $CF_4$, $C_2F_6$, $C_4F_8$, $CHF_3$, or $CH_2F_2$, a RF source power between about 200 to 600 Watts, a RF bias power from about 20 to 80 Watts, and a fluorocarbon flow rate of about 30 to 80 standard cubic centimeters per minute (sccm).

20. The method of claim 16 wherein the third RIE step is comprised of $CH_3OH$, $C_2H_5OH$, or $CO/NH_3$.

* * * * *